(12) United States Patent
Liu et al.

(10) Patent No.: US 10,787,364 B2
(45) Date of Patent: *Sep. 29, 2020

(54) DEVICE FOR MAKING CARBON NANOTUBE ARRAYS

(71) Applicants: Tsinghua University, Beijing (CN); HON HAI PRECISION INDUSTRY CO., LTD., New Taipei (TW)

(72) Inventors: Liang Liu, Beijing (CN); Qi Cai, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 34 days.

This patent is subject to a terminal disclaimer.

(21) Appl. No.: 16/155,901

(22) Filed: Oct. 10, 2018

(65) Prior Publication Data

US 2020/0017361 A1 Jan. 16, 2020

(30) Foreign Application Priority Data

Jul. 12, 2018 (CN) .......................... 2018 1 0764482

(51) Int. Cl.
*C01B 32/16* (2017.01)
*C01B 32/162* (2017.01)
(Continued)

(52) U.S. Cl.
CPC ........ *C01B 32/162* (2017.08); *C23C 16/0281* (2013.01); *C23C 16/26* (2013.01)

(58) Field of Classification Search
CPC ... C01B 32/16; C01B 32/162; C01B 2202/06; B01J 4/001; B01J 4/004; B01J 15/005; B01J 19/24; C23C 16/26
See application file for complete search history.

(56) References Cited

U.S. PATENT DOCUMENTS

| 6,284,312 B1* | 9/2001 | Chandra | C01B 33/027 423/349 |
| 7,615,205 B2* | 11/2009 | Jiang | B82Y 30/00 423/447.3 |

(Continued)

FOREIGN PATENT DOCUMENTS

TW  200711997 A  4/2007

OTHER PUBLICATIONS

Maya, Fernando, et al., "Improving the chemiluminescence-based determination of sulphide in complex environmental samples by using a new, automated multi-syringe flow injection analysis system coupled to a gas diffusion unit". Analytica Chimica Acta 601 (2007) pp. 87-94.*

(Continued)

*Primary Examiner* — Bret P Chen
(74) *Attorney, Agent, or Firm* — ScienBiziP, P.C.

(57) ABSTRACT

A device for making a carbon nanotube array includes a chamber, a gas diffusing unit, and a gas transporting pipe. The chamber defines a first inlet and a second inlet spaced apart from each other. The gas diffusing unit is in the chamber, and the gas diffusing unit is a hollow structure and defines a space, a first through hole, and an outlet. The gas transporting pipe has a first end and a second end opposite to the first end. The first end extends out of the chamber from the second inlet, and the second end is in the chamber and connected to the first through hole. The present application also relates to a method for making the carbon nanotube array.

16 Claims, 9 Drawing Sheets

(51) Int. Cl.
*C23C 16/26* (2006.01)
*C23C 16/02* (2006.01)

(56) References Cited

U.S. PATENT DOCUMENTS

| | | | |
|---|---|---|---|
| 7,625,544 B2 | 12/2009 | Liu et al. | |
| 9,101,890 B2* | 8/2015 | Tonkovich | C01B 3/38 |
| 10,450,191 B2* | 10/2019 | Liu | B01J 15/005 |
| 2006/0231970 A1* | 10/2006 | Huang | B81C 1/0069 |
| | | | 264/134 |
| 2008/0083612 A1* | 4/2008 | Wang | B82Y 30/00 |
| | | | 204/192.15 |
| 2011/0008963 A1* | 1/2011 | Liu | B82Y 30/00 |
| | | | 438/680 |
| 2013/0294999 A1* | 11/2013 | Liu | B82Y 40/00 |
| | | | 423/447.1 |
| 2014/0322608 A1* | 10/2014 | Claussen | H01M 4/587 |
| | | | 429/224 |
| 2018/0354784 A1* | 12/2018 | Liu | B01J 4/001 |
| 2018/0354803 A1* | 12/2018 | Liu | B81C 1/00031 |

OTHER PUBLICATIONS

Motomizu, Shoji, et al., "Gas-Diffusion Unit with Tubular Microporous Poly(tetrafluoroethylene) Membrane for Flow-Injection Determination of Carbon Dioxide". Anal. Chem. 1987, 59, 2930-2932.*

Frenzel, Wolfgang, "Gas-diffusion separation and flow injection potentiometry". Fresenius J Anal Chem (1990) 336:21-28.*

Cao, Dapeng, et al., "Self-Diffusion of Methane in Single-Walled Carbon Nanotubes at Sub- and Supercritical Conditions". Langmuir 2004, 20, 3759-3765.*

Stadermann, Michael, et al., "Mechanism and Kinetics of Growth Termination in Controlled Chemical Vapor Deposition Growth of Multiwall Carbon Nanotube Arrays". Nano Letters, vol. 9, No. 2, 2009, pp. 738-744.*

Tang, Xian, et al., "Mass-transport-controlled, large-area, uniform deposition of carbon nanofibers and their application in gas diffusion layers of fuel cells". Nanoscale, 2015, 7, 7971-7979.*

* cited by examiner

DEVICE FOR MAKING CARBON NANOTUBE ARRAYS

FIELD

The present application relates to a device and method for making carbon nanotube arrays.

BACKGROUND

Carbon nanotubes can be composed of a number of coaxial cylinders of graphite sheets, and have recently attracted a great deal of attention for use in different applications, such as field emitters, chemical sensors, and so on. Carbon nanotubes can be prepared by Chemical Vapor Deposition (CVD), Arc Discharge, or Laser Ablation. When growing carbon nanotube arrays on a growth substrate by the CVD method, the carbon nanotube arrays adhere to the growth substrate and it can be difficult to separate the carbon nanotube array from the growth substrate. Furthermore, it can be difficult to obtain an integrated carbon nanotube array by peeling the carbon nanotube array from the growth substrate using a knife or a tweezer, because the bonding force between the carbon nanotubes and the growth substrate is strong.

Therefore, there is room for improvement in the art.

BRIEF DESCRIPTION OF THE DRAWINGS

Implementations of the present technology will now be described, by way of example only, with reference to the attached figures, wherein.

DETAILED DESCRIPTION

Figure 1:
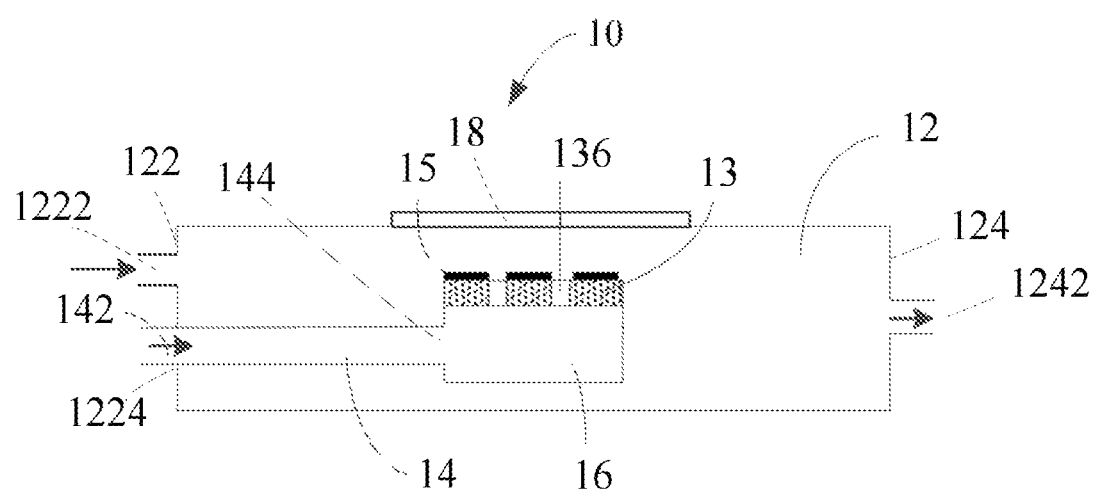
FIG. 1 is a schematic of a first embodiment of a device for making a carbon nanotube array.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 5:
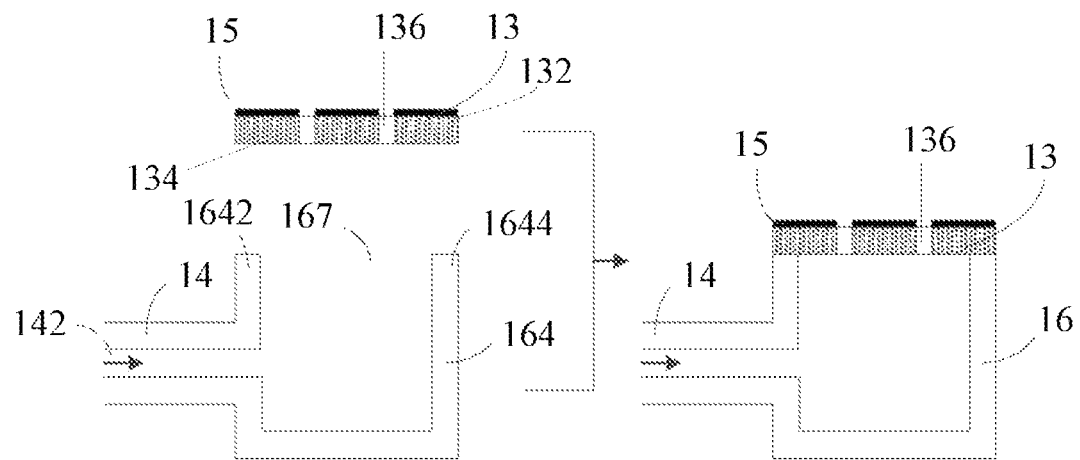
FIG. 5 is a schematic of the first embodiment of a composite structure formed by a gas transporting pipe, the gas diffusing unit and the growth substrate.

FIG. 1 and FIG. 5 show a device 10 for making a carbon nanotube array in a first embodiment and that includes a chamber 12, a gas transporting pipe 14, a gas diffusing unit 16, and a heater 18. The gas transporting pipe 14 and the gas diffusing unit 16 are located in the chamber 12.

The chamber 12 has a first sidewall 122 and a second sidewall 124 opposite to the first sidewall 122. The first sidewall 122 defines a first inlet 1222 and a second inlet 1224 spaced apart from the first inlet 1222, and the second sidewall 124 defines a first outlet 1242. The carbon source gas and the protective gas enter the chamber 12 from the first inlet 1222, and gas generated by various reactions in the chamber 12 can be exhausted from the first outlet 1242. The chamber 12 can be formed by a material with stable chemical properties and high temperature resistance. In one embodiment, the chamber 12 is a quartz tube. A flowmeter can be installed in the chamber 12 to detect the gas flow, or a pressure sensor, such as a piezometer, can be installed in the chamber 12 to detect the pressure of the chamber 12. The chamber 12 can be connected to a vacuum pump to reduce the pressure in the chamber 12.

The gas transporting pipe 14 transports gas to the gas diffusing unit 16. The gas transporting pipe 14 has a first end 142 and a second end 144 opposite to the first end 142, the second end 144 is in communication with the chamber 12 and connected to the gas diffusing unit 16, and the first end 142 passes through the second inlet 1224 and extends out of the chamber 12, communicating with the outside of the chamber 12. The gas transporting pipe 14 is sealingly connected to the gas diffusing unit 16. The connection manner between the gas transporting pipe 14 and the gas diffusing unit 16 is not limited, as long as gas can be supplied or diffused from the gas transporting pipe 14 to the gas diffusing unit 16. The gas transporting pipe 14 can be integrated with the gas diffusing unit 16. The gas transporting pipe 14 can also be detachably connected to the gas diffusing unit 16.

Figure 2:
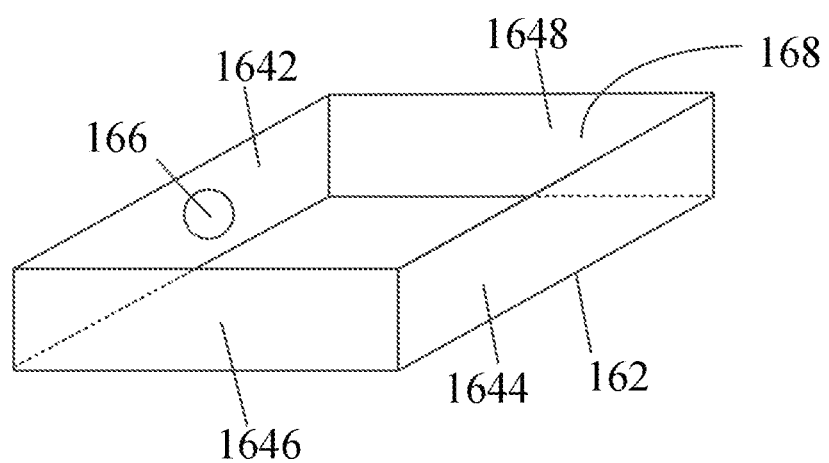
FIG. 2 is a schematic of the first embodiment of a gas diffusing unit.

The gas diffusing unit 16 diffuses the gas into the chamber 12 and supports a growth substrate 13 for growing carbon nanotube arrays. FIG. 2 and FIG. 5 show the gas diffusing unit 16 is a hollow structure and includes a bottom wall 162 and a sidewall 164. The sidewall 164 defines a first through hole 166, and the second end 144 of the gas transporting pipe 14 passes through the first through hole 166, so that the gas transporting pipe 14 inserts into the gas diffusing unit 16. The gas diffusing unit 16 defines a space 168 and a second outlet 167, and the second outlet 167 is opposite to the bottom wall 162. The sidewall 164 and the bottom wall 162 define the space 168. The sidewall 164 can be cubic, circular, or a trapezoidal. Thus, the shape of the gas diffusing unit 16 is not limited, such as, cubic, circular, or trapezoidal. In one embodiment, the shape of the gas diffusing unit 16 is cubic. As shown in FIG. 2, the sidewall 164 includes a first sidewall 1642, a second sidewall 1644 opposite to the first sidewall 1642, a third sidewall 1646, and a fourth sidewall 1648 opposite to the third sidewall 1646. The first sidewall 1642 defines the first through hole 166, and the gas transporting pipe 14 inserted into the first through hole 166. The bottom wall 162, the first sidewall 1642, the second sidewall 1644, the third sidewall 1646, and the fourth sidewall 1648 encircle the space 168. The gas enters the gas transporting pipe 14 from the first end 142, passes through the gas transporting pipe 14 to enter the gas diffusing unit 16, and finally passes through the second outlet 167 to enter the chamber 12. The gas diffusing unit 16 can be a semi-closed container. In one embodiment, the gas diffusing unit 16 is a quartz boat.

Figure 3:
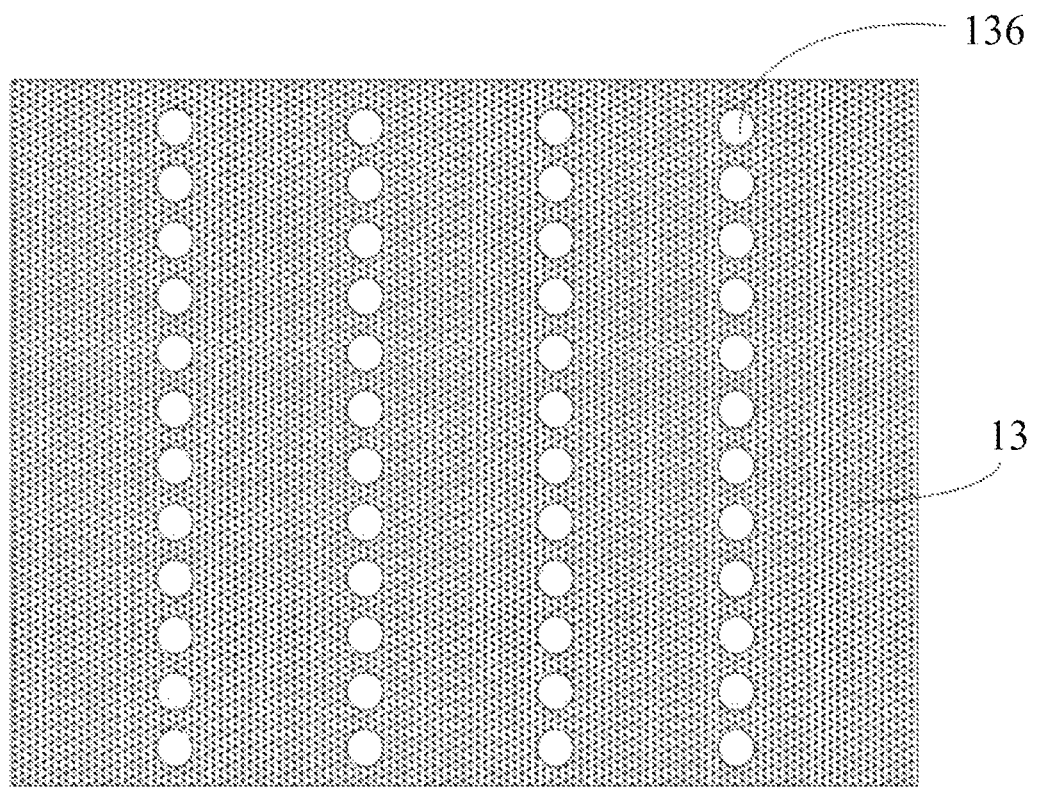
FIG. 3 is a schematic of the first embodiment of a growth substrate.
Figure 4:
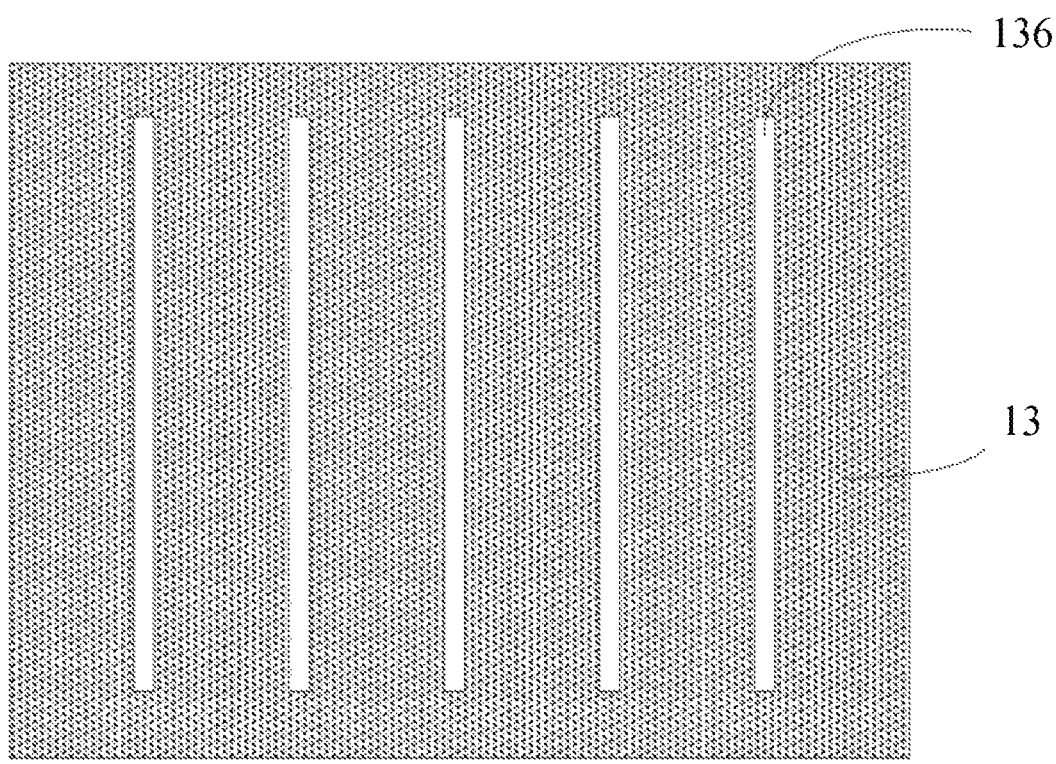
FIG. 4 is a schematic of the first embodiment of another growth substrate.

The growth substrate 13 growing carbon nanotube arrays has a first growth substrate surface 132 and a second growth substrate surface 134 opposite to the first growth substrate surface 132. The growth substrate 13 defines a plurality of spaced-apart second through holes 136. The second through holes 136 passes through the growth substrate 13 along the thickness direction of the growth substrate 13, and each second through hole 136 extends from the first growth substrate surface 132 to the second growth substrate surface 134, as shown in FIG. 5. The shape of each second through hole 136 is not limited, such as circle, square, triangle, diamond, or rectangle. The shapes of the second through holes 136 can be different from each other. When the second through hole 136 is a circular, as shown in FIG. 3, the diameter of the circular through hole is in a range from about 10 nanometers to about 1 centimeter. When the second through hole 136 is a strip through hole, as shown in FIG. 4, the width of the strip through hole is in a range from about 10 nanometers to about 1 centimeter.

The growth substrate 13 is resistant to high temperatures, does not react with the carbon source gas and the protective gas, and does not undergo atomic permeation. The material of the growth substrate 13 can be silicon, quartz, or the like. In one embodiment, the growth substrate 13 is a silicon wafer. A protective layer is formed on the silicon wafer, for example, the protective layer is a silicon oxide layer, and the thickness of the silicon oxide layer ranges from about 1 nanometer to about 1000 nanometers. The first growth substrate surface 132 can be treated by mechanical polishing or electrochemical polishing, to ensure the smoothness of the first growth substrate surface 132 meets the needs of growing carbon nanotube arrays.

FIG. 5 shows the growth substrate 13 is suspended on the gas diffusing unit 16 and covers the second outlet 167. The method for placing the growth substrate 13 on the sidewall 164 of the gas diffusing unit 16 is not limited. In one embodiment, the size of the growth substrate 13 is greater than the size of the second outlet 167, such that the growth substrate 13 is directly placed on the sidewall 164 and cover the second outlet 167. The gas in the gas diffusing unit 16 can pass through the second outlet 167 and the second through holes 136 to enter the inside of the chamber 12.

The heater 18 heats the growth substrate 13. The heater 18 is located inside of the chamber 12, or located outside of the chamber 12. The heater 18 can be formed by carbon nanotubes or electrothermal resistance wires surrounding the periphery of the chamber 12 to heat the inside of the chamber 12, so that the growth substrate 13 is heated. In other embodiments, the heater 18 can also be a high-frequency furnace or a laser heater, that only heats the growth substrate 13. For example, the heater 18 is disposed above or below the gas diffusing unit 16, only to heat the growth substrate 13 without heating the entire chamber 12, thereby saving energy.

Figure 6:
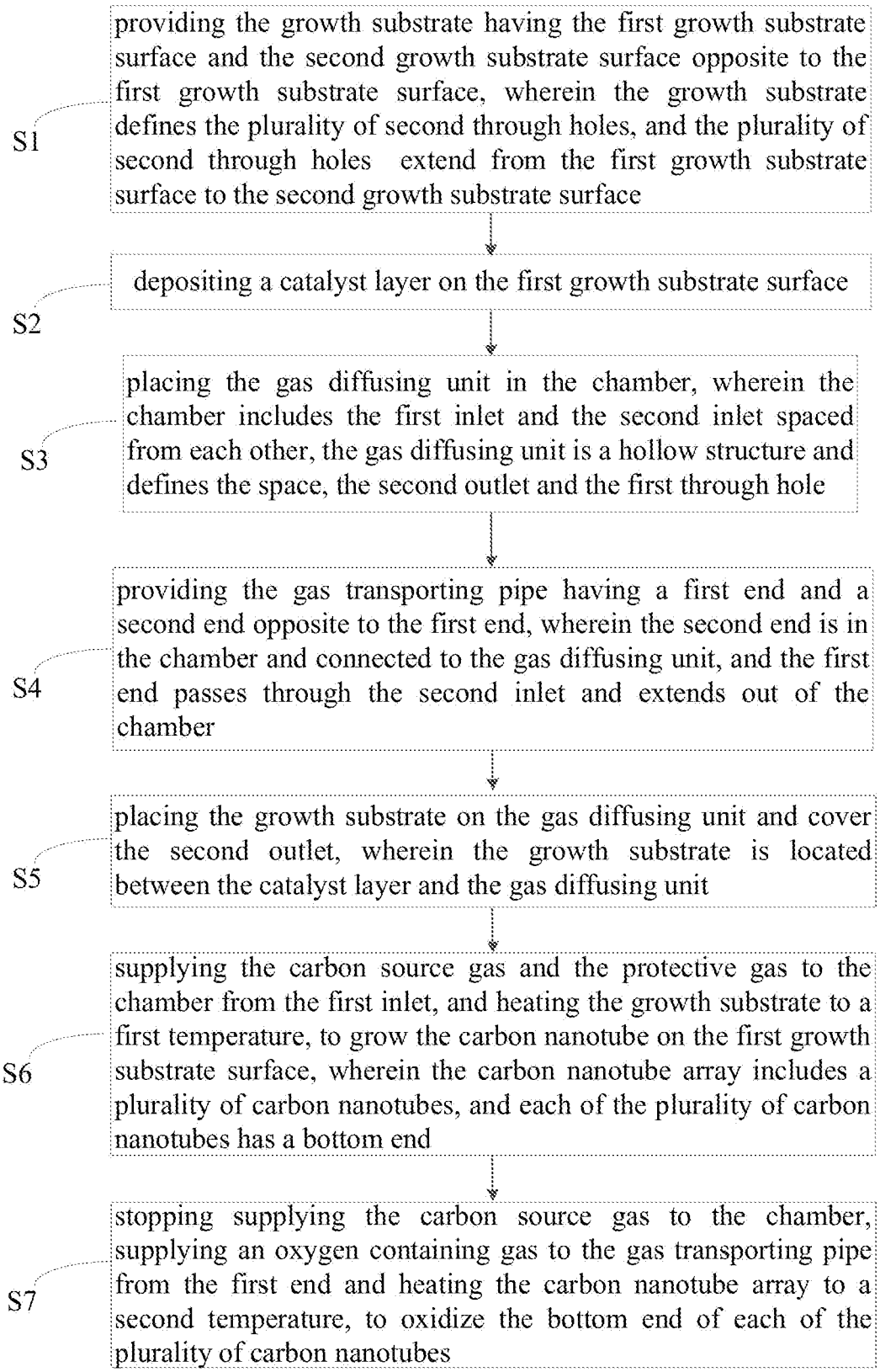
FIG. 6 is a process flow of a method for making the carbon nanotube array using the device of FIG. 1.

FIG. 6 shows a method for making the carbon nanotube array by the device 10 of FIG. 1. Depending on the embodiment, certain of the steps or blocks described may be removed, others may be added, and the sequence of steps or blocks may be altered. It is also to be understood that the description and the claims drawn to a method may include some reference numeral indication referring to certain blocks or steps. However, the reference numeral indication used is only for identification purposes and not interpreted as a suggestion as to an order for the steps. The method includes one or more of the following steps:

S1, providing the growth substrate 13 having the first growth substrate surface 132 and the second growth substrate surface 134 opposite to the first growth substrate surface 132, wherein the growth substrate 13 defines the second through holes 136, and the second through holes 136 extend from the first growth substrate surface 132 to the second growth substrate surface 134;

S2, depositing a catalyst layer 15 on the first growth substrate surface 132;

S3, placing the gas diffusing unit 16 in the chamber 12, wherein the chamber 12 includes the first inlet 1222 and the second inlet 1224 spaced apart from each other, the gas diffusing unit 16 is a hollow structure and defines the space 168, the second outlet 167 and the first through hole 166;

S4, providing the gas transporting pipe 14 having a first end 142 and a second end 144 opposite to the first end 142, wherein the second end 144 is in the chamber 12 and connected to the gas diffusing unit 16, and the first end 142 passes through the second inlet 1224 and extends out of the chamber 12;

S5, placing the growth substrate 13 on the gas diffusing unit 16 and cover the second outlet 167, wherein the growth substrate 13 is located between the catalyst layer 15 and the gas diffusing unit 16;

S6, supplying the carbon source gas and the protective gas to the chamber 12 from the first inlet 1222, and heating the growth substrate 13 to a first temperature, to grow the carbon nanotube array on the first growth substrate surface 132, wherein the carbon nanotube array includes a plurality of carbon nanotubes, and each of the plurality of carbon nanotubes has a bottom end; and S7, stopping supplying the carbon source gas to the chamber 12, supplying an oxygen containing gas to the gas transporting pipe 14 from the first end 142 and heating the carbon nanotube array to a second temperature, to oxidize the bottom end of each of the plurality of carbon nanotubes.

During step S2, the thickness of the catalyst layer 15 ranges from about 1 nanometer to about 10 nanometers. In one embodiment, the thickness of the catalyst layer 15 ranges from about 1 nanometer to about 5 nanometers. The catalyst layer 15 can be formed on the first growth substrate surface 132 by evaporation, sputtering, or chemical deposition. The material of the catalyst layer 15 can be iron, cobalt, nickel, or an alloy of any combination thereof. The catalyst layer 15 can further be annealed, the annealing under air atmosphere temperature ranges from about 200 degrees Celsius to about 400 degrees Celsius, and the annealing time ranges from about 8 hours to about 12 hours. After annealing the catalyst layer 15 under an air atmosphere, the catalyst layer 15 can be oxidized to form metal oxide, and the catalyst layer 15 can become uniformly distributed metal oxide catalyst nanoparticles. The catalytic activity of the catalyst nanoparticles is better than the catalytic activity of the continuous catalyst layer 15. In one embodiment, the material of the catalyst layer 15 is iron, the thickness of the iron catalyst layer 15 is about 2 nanometers, and the iron catalyst layer 15 is annealed at 300 degrees Celsius for 10 hours under the air atmosphere.

When the growth substrate 13 is a silicon substrate, the metal of the catalyst layer 15 deposited on the first growth substrate surface 132 may react with the silicon of the first growth substrate surface 132 to form an alloy, and this alloy would affect the activity of the catalyst layer 15. Thus, before the catalyst layer 15 is deposited on the first growth substrate surface 132 of the silicon substrate, a catalyst carrier layer can be formed on the first growth substrate surface 132. Thus, the metal of the catalyst layer 15 cannot react with the first growth substrate surface 132, and the activity of the catalyst layer 15 would not be affected. The material of the catalyst carrier layer can be aluminum (Al), aluminum oxide ($Al_2O_3$), silicon oxide ($SiO_2$), or magnesium oxide (MgO). The thickness of the catalyst carrier layer ranges from about 1 nanometer to about 10 nanometers. In one embodiment, the catalyst carrier layer is an aluminum layer, and the thickness of the aluminum layer ranges from about 3 nanometers to about 7 nanometers. It is understood that the catalyst layer 15 and the catalyst carrier layer do not cover each second through hole 136. The oxygen containing gas can still enter the chamber 12 by passing through the second through holes 136 after forming the catalyst layer 15 and the catalyst carrier layer.

During step S5, the growth substrate 13 is suspended on the second outlet 167 of the gas diffusing unit 16 and cover the second outlet 167. The first growth substrate surface 132 of the growth substrate 13 is away from the gas diffusing unit 16, some portions of the second growth substrate surface 134 of the growth substrate 13 is in direct contact with the sidewall 164 of the gas diffusing unit 16.

During step S6, the protective gas is an inert gas or nitrogen. The carbon source gas is a hydrocarbon compound, such as acetylene, ethylene, methane, ethane, or the like. The first temperature is the growth temperature of the carbon nanotube array. The first temperature ranges from 600 degrees Celsius to 720 degrees Celsius. In one embodiment, the first temperature ranges from 620 degrees Celsius to 700 degrees Celsius. The growth substrate 13 is heated to the first temperature under a protective gas atmosphere, and then the carbon source gas and the protective gas mixture is supplied into the chamber 12, so that the carbon nanotube array is grown on the first growth substrate surface 132 by chemical vapor deposition. The time for supplying the carbon source gas and the protective gas mixture ranges from about 10 minutes to about 40 minutes. During growing carbon nanotube arrays on the first growth substrate surface 132, the pressure in the chamber 12 ranges from about 2 tons to 8 tons.

The carbon source gas, such as acetylene, direct contacts the catalyst layer 15 and pyrolyzed into carbon units (—C≡C— or C) and hydrogen ($H_2$) due to the catalysis of the catalyst layer 15. When the hydrogen diffuses to the surface of the metal oxide catalyst nanoparticles, the metal oxide catalyst nanoparticles can be reduced to metal catalyst nanoparticles. Thus, the oxidized catalyst can be reduced and activated. Then, the carbon units are adsorbed on the surface of catalyst layer 15, thereby growing carbon nanotube arrays on the first growth substrate surface 132. In one embodiment, the protective gas is nitrogen, the carbon source gas is acetylene, the first temperature is about 700 degrees Celsius, and the pressure of the chamber 12 is about 5 tons.

Each carbon nanotube includes a top end, the bottom end, and a middle portion between the top end and the bottom end. The bottom end is in direct contact with the first growth substrate surface 132, and the middle portion and the top end are away from the first growth substrate surface 132.

During step S7, stopping supplying the carbon source gas to the chamber 12, continuously supplying the protective gas to chamber 12 from the first inlet 1222 and supplying the oxygen containing gas to the gas transporting pipe 14 from the first end 142. Alternatively, stopping supplying the carbon source gas to the chamber 12, and supplying the oxygen containing gas and the protective gas to the gas transporting pipe 14 from the first end 142. The oxygen containing gas passes through the gas transporting pipe 14, the gas diffusing unit 16, and the second through holes 136 of the growth substrate 13 to reach the first growth substrate surface 132, so the bottom ends of the carbon nanotubes are oxidized at the second temperature. The oxygen containing gas can be pure oxygen or air. The flow rate of oxygen containing gas ranges from about 300 standard millimeters per minute (sccm) to 500 sccm. The temperature of the growth substrate 13 is changed to be the second temperature, the second temperature is the temperature of oxidizing the bottom ends of the carbon nanotubes, and the second temperature can be in a range from about 500 degrees Celsius to about 800 degrees Celsius. The time for oxidizing the bottom ends of the carbon nanotubes by the oxygen containing gas is defined as an oxidizing time, and the oxidizing time is in a range from about 5 minutes to about 20 minutes. During oxidizing the bottom ends of the carbon nanotubes, the pressure in the chamber 12 is still in a range from about 2 torrs to about 8 torrs. In one embodiment, the pressure in the chamber 12 is about 5 torrs. The flow rate of oxygen containing gas, the oxidizing time, and the pressure in the chamber 12 can ensure that only bottom ends of the carbon nanotubes are oxidized.

After the bottom ends of the carbon nanotubes are oxidized, the supply of oxygen containing gas is stopped, but the supplying of the protective gas from the first inlet 1222 or the second inlet 1224 continues. After the temperatures of the oxidized carbon nanotube array and growth substrate 13 naturally fall below 400 degrees Celsius, the growth substrate 13 and the oxidized carbon nanotube array are slowly taken out of the chamber 12.

In one embodiment, the second temperature is 700 degrees Celsius, the flow rate of the oxygen containing gas is 500 sccm, and the oxidizing time ranges from about 9 minutes to about 10 minutes. In one embodiment, the second temperature is 800 degrees Celsius, the flow rate of the oxygen containing gas is 300 sccm, and the oxidizing time ranges from about 5 minutes to about 7 minutes. In one embodiment, the second temperature is 500 degrees Celsius, the flow rate of the oxygen containing gas is 500 sccm, and the oxidizing time ranges from about 16 minutes to about 20 minutes. In one embodiment, the oxygen containing gas is supplied in the process of naturally reducing the temperatures of the growth substrate 13, the flow rate of the oxygen containing gas is 500 sccm, and the oxidizing time ranges from about 13 minutes to about 15 minutes.

The second temperature, the oxidizing time, and the flow rate of the oxygen containing gas are related to the quality of the carbon nanotube array. When the quality of the carbon nanotube array is low, for example, the carbon nanotube array contains many defects and amorphous carbons, the second temperature can be appropriately decreased, the oxidizing time can be shortened, and the flow rate of the oxygen containing gas can be decreased. When the quality of the carbon nanotube array is high, for example, the carbon nanotube array substantially has no impurity, the second temperature can be appropriately increased, the oxidizing time can be prolonged, and the flow rate of the oxygen containing gas can be increased.

It can be understood that when the second temperature and the flow rate of the oxygen containing gas are constant, the oxidizing time cannot be too long or too short. When the oxidizing time is too long, the carbon nanotube array is can be seriously damaged and the height of the carbon nanotube array will be greatly reduced. When the oxidizing time is too short, separating the oxidized carbon nanotube array from the growth substrate 13 can be difficult.

After step S7, a step of separating the oxidized carbon nanotube array from the growth substrate 13 is further included. After the bottom ends of the carbon nanotubes are oxidized, the oxidized carbon nanotube array is separated from the growth substrate 13 just by applying an external force, such as, just lightly shaking the growth substrate 13, just blowing on the oxidized carbon nanotube array, just tilting the growth substrate 13, or just reversing the growth substrate 13. In one embodiment, after the bottom ends of the carbon nanotubes are oxidized, the oxidized carbon nanotube array is separated from the growth substrate 13 just by blowing on the oxidized carbon nanotube array by mouth. When the growth substrate 13 is tilted, an extending direction of the growth substrate 13 and a horizontal plane form an angle, and the angle is larger than or equal to 30 degrees. In one embodiment, the angle is equal to about 90 degrees. When the growth substrate 13 is tilted or reversed, the oxidized carbon nanotube array falls only by gravity. Alternatively, the oxidized carbon nanotube array is more easily peeled from the growth substrate 13 using a knife or a tweezers than the non-oxidized carbon nanotube array. Furthermore, when the growth substrate 13 and the oxidized carbon nanotube array are taken out of the chamber 12, taking the growth substrate 13 and the oxidized carbon nanotube array out of the chamber 12 cannot be too fast, and the speed of taking the growth substrate 13 and the oxidized carbon nanotube array out of the chamber 12 is greater than 0 cm/min and less than 100 cm/min. When the speed of taking the growth substrate 13 and the oxidized carbon nanotube array out of the chamber 12 is greater than or equal to 100 cm/min, the oxidized carbon nanotube array can fall off the growth substrate 13.

In the process of growing carbon nanotube arrays, for each carbon nanotube, first the top end grows, then the middle portion grows, and finally the bottom end grows. At the later growth stage of the carbon nanotube array, the catalytic activity of the catalyst layer 15 decreases, resulting in the bottom end having more defects than the top end and the middle portion. When the oxygen containing gas is supplied to the carbon nanotube array, the oxygen containing gas can contact the top end, the bottom end, and the middle portion of each carbon nanotube. However, it is easier for the oxygen containing gas to react with the bottom end than to react with the top end and the middle portion, because the bottom end has more defects than the top end and the middle portion. The reaction between the oxygen containing gas and the bottom end produces carbon dioxide and weakens the bonding force between each carbon nanotube and the first growth substrate surface 132 of the growth substrate 13. The middle portion and the top end of each carbon nanotube only have a few defects, thus it is not easy for the middle portion and the top end to react with the oxygen containing gas, thereby keeping the integrity of the carbon nanotube array. Thus, the top end and the middle portion of each carbon nanotube are not oxidized, and the bottom end of each carbon nanotube is oxidized.

The bottom end of each carbon nanotube is oxidized, to weaken the bonding force between the bottom end of each carbon nanotube and the first growth substrate surface 132 allowing for easy separation using the methods described above. Thus, the structure of the carbon nanotube array cannot be destroyed, and an integrated carbon nanotube array can be obtained. Additionally, when the bottom end of each carbon nanotube is separated from the growth substrate 13, the catalyst layer 15 remains on the first growth substrate surface 132 of the growth substrate 13. The carbon nanotube array contains a few catalyst metal particles or does not contain the catalyst metal particles after being separated from the growth substrate 13, thereby improving the quality or the purity of the carbon nanotube array.

The original carbon nanotube array growing on the first growth substrate surface 132 and the oxidized carbon nanotube array are the same except for their bottom ends. The bottom ends of the original carbon nanotube array are not oxidized. When only bottom ends of the original carbon nanotube array are oxidized, the oxidized carbon nanotube array is formed. Furthermore, the original carbon nanotube array is a free-standing structure. The term "free-standing" includes, but not limited to, the original carbon nanotube array that does not have to be supported by a substrate. For example, the free-standing carbon nanotube array can sustain the weight of itself when it is hoisted by a portion thereof without any significant damage to its structural integrity. So, if the free-standing carbon nanotube array is placed between two separate supporters, a portion of the free-standing carbon nanotube array, not in contact with the two supporters, would be suspended between the two supporters and yet maintain film structural integrity. The oxidized carbon nanotube array is also a free-standing structure. The oxidized carbon nanotube array separated from the growth substrate 13 is still a free-standing structure.

The oxygen containing gas enters the gas transporting pipe 14 from the first end 142, and passes through the gas transporting pipe 14, the gas diffusing unit 16, and the second through holes 136 of the growth substrate 13, to enter the chamber 12. In the process of supplying the oxygen containing gas to the chamber 12, the oxygen containing gas can only contact with and oxidize the bottom end of each carbon nanotube by controlling the time for supplying the oxygen containing gas to the chamber 12. For example, after oxidizing the bottom end of each carbon nanotube, the supplying of the oxygen containing gas is stopped. Thus, the chances of reacting the middle portion and top end of each carbon nanotube with the oxygen containing gas can be reduced, reducing the loss of the carbon nanotube array and improving the integrity of the carbon nanotube array.

Figure 7:
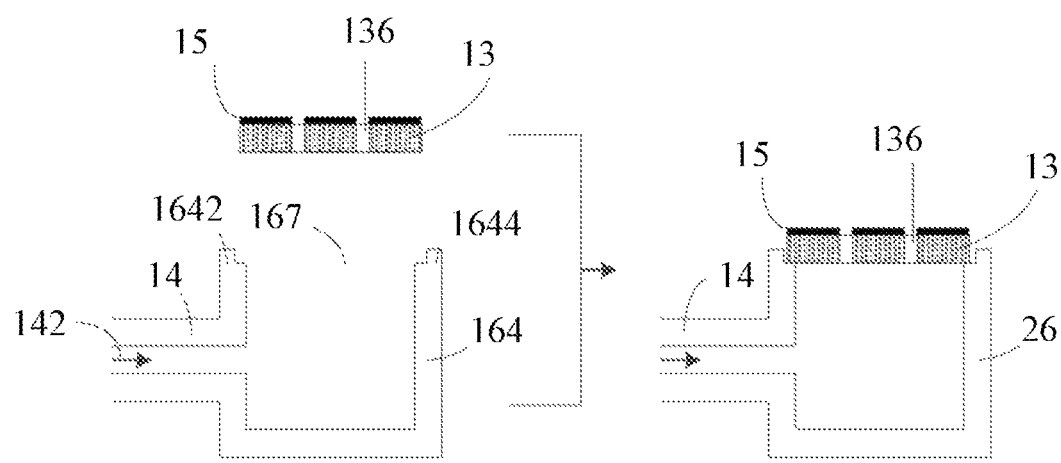
FIG. 7 is a schematic of a second embodiment of a composite structure formed by the gas transporting pipe, a gas diffusing unit and the growth substrate.

FIG. 7 shows a gas diffusing unit 26 of a second embodiment. The gas diffusing unit 26 is similar to the gas diffusing unit 16 of the first embodiment above except that each of at least the first sidewall 1642 and the second sidewall 1644 has a step. The step is in the space 168 and used for supporting the growth substrate 13. The step is adjacent to one end of each of the first sidewall 1642 and the second sidewall 1644. The growth substrate 13 can be located on and fixed by the steps of the first sidewall 1642 and the second sidewall 1644.

In the second embodiment, the method for separating the oxidized carbon nanotube array from the growth substrate 13 is provided. The method for separating the oxidized carbon nanotube array from the growth substrate 13 in the second embodiment is similar to the method for separating the oxidized carbon nanotube array from the growth substrate 13 in the first embodiment.

Figure 8:
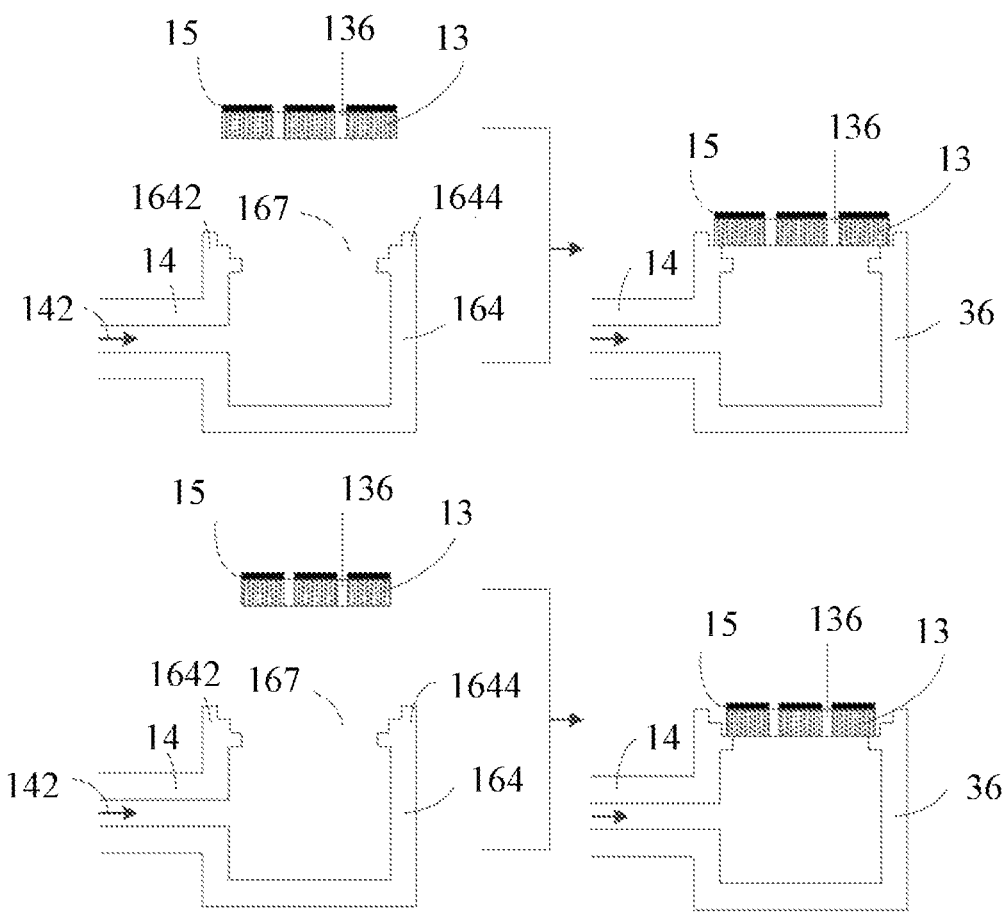
FIG. 8 is a schematic of a third embodiment of a composite structure formed by the gas transporting pipe, a gas diffusing unit and the growth substrate.

FIG. 8 shows a gas diffusing unit 36 of a third embodiment The gas diffusing unit 36 is similar to the gas diffusing unit 26 of the second embodiment above except that each of at least the first sidewall 1642 and the second sidewall 1644 has a plurality of steps. The plurality of steps are in the space 168 and can be used for supporting a plurality of growth substrates 13 with different sizes, thereby meeting different production needs.

In the third embodiment, the method for separating the oxidized carbon nanotube array from the growth substrate 13 is provided. The method for separating the oxidized carbon nanotube array from the growth substrate 13 in the third embodiment is similar to the method for separating the oxidized carbon nanotube array from the growth substrate 13 in the first embodiment.

Figure 9:
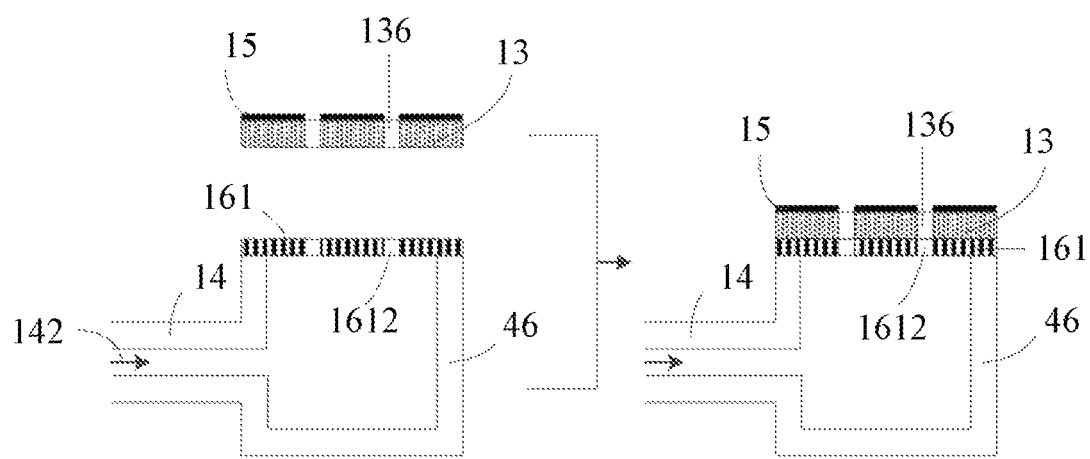
FIG. 9 is a schematic of a fourth embodiment of a composite structure formed by the gas transporting pipe, a gas diffusing unit and the growth substrate.

FIG. 9 shows a gas diffusing unit 46 of a fourth embodiment. The gas diffusing unit 46 is similar to the gas diffusing unit 16 of the first embodiment above except that the gas diffusing unit 46 further includes a plate 161 covering the second outlet 167, and the plate 161 has a plurality of third through holes 1612 spaced from each other. The plate 161 supports the growth substrate 13. The material of the plate 161 is not limited. In one embodiment, the plate 161 is a quartz mesh, and plurality of third through holes 1612 is correspond to the second through holes 136 of the growth substrate 13 one to one. The gas in the gas diffusing unit 16 can enter inside of the chamber 12 by passing through the plurality of third through holes 1612 and the second through holes 136.

In the fourth embodiment, the method for separating the oxidized carbon nanotube array from the growth substrate 13 is provided. The method for separating the oxidized carbon nanotube array from the growth substrate 13 in the fourth embodiment is similar to the method for separating the oxidized carbon nanotube array from the growth substrate 13 in the first embodiment.

The devices and the method above for making the carbon nanotube array have the following advantages: the chamber 12 defines the first inlet 1222 and the second inlet 1224 spaced from each other, and the first end 142 of the gas transporting pipe 14 passes through the second inlet 1224 to extend out of the chamber 12; the carbon source gas and the protective gas are supplied to the chamber 12 from the first inlet 1222, to grow the carbon nanotube array on the first growth substrate surface 132 of the growth substrate 13; and after growing carbon nanotube arrays is finished, the oxygen containing gas and the protective gas mixture or only the oxygen containing gas enters the chamber 12 from the first end 142 of the gas transporting pipe 14, to oxidize the bottom ends of the carbon nanotubes. Thus, the bonding force between each carbon nanotube and the first growth substrate surface 132 of the growth substrate 13 is weakened, thus an integrated carbon nanotube array can be separated from the growth substrate 13.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A device for making a carbon nanotube array, the device comprising:
   a chamber defining a first inlet and a second inlet spaced apart from each other;
   a gas diffusing unit in the chamber, wherein the gas diffusing unit is a hollow structure and defines a space, a first through hole, and an outlet; and the gas diffusing unit comprises a first sidewall and a second sidewall opposite to the first sidewall, each of the first sidewall and the second sidewall has a plurality of steps, and the plurality of steps is inside of the space; and
   a gas transporting pipe having a first end and a second end opposite to the first end, wherein the gas transporting pipe extends out of the chamber through the second inlet, and the second end is in the chamber and connected to the first through hole.

2. The device of claim 1, wherein the gas diffusing unit comprises a bottom wall and a sidewall, the sidewall defines the first through hole, and the outlet is opposite to the bottom wall.

3. The device of claim 2, wherein the sidewall forms a cube, a circle, or a trapezoid.

4. The device of claim 2, wherein the sidewall is used to support a growth substrate having a second through holes, and the growth substrate covers the outlet.

5. The device of claim 1, wherein the second end is inserted into the first through hole.

6. The device of claim 1, wherein a shape of the gas diffusing unit is cubic.

7. The device of claim 1, wherein the gas diffusing unit is a semi-closed container integrated with the gas transporting pipe.

8. The device of claim 1, wherein the gas transporting pipe is a quartz tube, and the gas diffusing unit is a quartz boat.

9. The device of claim 1, wherein the gas diffusing unit further comprises a plate covering the outlet, and the plate defines a plurality of third through holes spaced apart from each other.

10. The device of claim 9, wherein the plate is a quartz sheet or a metal mesh.

11. The device of claim 9, wherein the plate supports a growth substrate having a plurality of second through holes, and the plurality of third through holes corresponds to the plurality of second through holes one to one.

12. A device for making a carbon nanotube array, the device comprising:
   a chamber defining a first inlet and a second inlet spaced apart from each other;
   a gas diffusing unit in the chamber, wherein the gas diffusing unit is a hollow structure and defines a space, a first through hole, and an outlet;

a growth substrate located on and covering the outlet, wherein the growth substrate has a plurality of second through holes; and a gas transporting pipe having a first end and a second end opposite to the first end, wherein the gas transporting pipe extends out of the chamber through the second inlet, and the second end is in the chamber and connected to the first through hole.

13. The device of claim 12, wherein the growth substrate has a first surface and a second surface opposite to the first surface, a carbon nanotube array is located on the first surface, and the second surface is in direct contact with the outlet.

14. The device of claim 13, wherein the plurality of second through holes extends from the first surface to the second surface.

15. The device of claim 13, wherein the first surface and the second surface cover the outlet.

16. The device of claim 12, wherein the gas diffusing unit comprises a first sidewall and a second sidewall opposite to the first sidewall, each of the first sidewall and the second sidewall has a plurality of steps, and the plurality of steps is inside of the space.

\* \* \* \* \*